(12) United States Patent
Farmer et al.

(10) Patent No.: US 10,333,088 B1
(45) Date of Patent: Jun. 25, 2019

(54) CARBON NANOTUBE TRANSISTOR WITH CARRIER BLOCKING USING THIN DIELECTRIC UNDER CONTACT

(71) Applicant: International Business Machines Corporation, Armonk, NY (US)

(72) Inventors: Damon Brooks Farmer, White Plains, NY (US); Shu-Jen Han, Cortlandt Manor, NY (US); Jianshi Tang, Elmsford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/838,487

(22) Filed: Dec. 12, 2017

(51) Int. Cl.
*H01L 29/08* (2006.01)
*H01L 51/05* (2006.01)
*C01B 32/168* (2017.01)
*H01L 51/00* (2006.01)
*H01L 21/04* (2006.01)
*H01L 21/20* (2006.01)
*H01L 27/28* (2006.01)

(52) U.S. Cl.
CPC ........ *H01L 51/0558* (2013.01); *C01B 32/168* (2017.08); *H01L 21/041* (2013.01); *H01L 21/20* (2013.01); *H01L 27/283* (2013.01); *H01L 51/0048* (2013.01); *H01L 51/057* (2013.01)

(58) Field of Classification Search
CPC .................................................. H01L 51/0558
USPC ............................................................. 257/40
See application file for complete search history.

(56) References Cited

U.S. PATENT DOCUMENTS

| 5,506,422 | A  | 4/1996  | Dreifus et al.   |
|-----------|----|---------|------------------|
| 7,253,065 | B2 | 8/2007  | Appenzeller et al. |
| 7,598,516 | B2 | 10/2009 | Avouris et al.   |
| 8,471,249 | B2 | 6/2013  | Chiu et al.      |
| 8,872,172 | B2 | 10/2014 | Cheng et al.     |
| 9,312,183 | B1 | 4/2016  | Kim et al.       |
| 9,589,851 | B2 | 3/2017  | Bu et al.        |
| 9,735,111 | B2 | 8/2017  | Ando et al.      |

(Continued)

OTHER PUBLICATIONS

Farmer, et al., "N-Type End-Bonded Metal Contacts for Carbon Nanotube Transistors," U.S. Appl. No. 15/210,491, filed Jul. 14, 2016, 24 pages.

(Continued)

*Primary Examiner* — Ajay Arora
(74) *Attorney, Agent, or Firm* — Amin, Turocy & Watson, LLP

(57) ABSTRACT

The subject embodiments relate to carbon nanotube (CNT) transistors with carrier blocking using thin dielectric under the drain or source and drain contacts. According to an embodiment, a transistor is provided that comprises a CNT channel layer, a metal source contact formed on the carbon nanotube channel layer, and a metal drain contact formed on the carbon nanotube channel layer. The transistor structure further comprises a drain dielectric layer formed adjacent to and between a lower surface of the metal drain contact and an upper surface of the carbon nanotube channel layer. In one or more implementations, the drain dielectric layer comprises a material that suppresses injection of a first type of carrier into the CNT channel layer and facilitates the injection of a second type of carrier into the CNT channel layer.

17 Claims, 11 Drawing Sheets

(56) References Cited

U.S. PATENT DOCUMENTS

2006/0220074 A1* 10/2006 Datta .................... B82Y 10/00
                                                    257/288
2014/0120714 A1*  5/2014 Farmer ............. H01L 21/02603
                                                    438/610

OTHER PUBLICATIONS

Franklin, et al., "Sub-10 nm Carbon Nanotube Transistor," dx.doi.org/10.1021/nI203701g, Nano Lett. 2012, 12, 758-762.

* cited by examiner

A – Device A (e.g. no contact dielectric)
B – Device B (e.g. CNT transistor 103)
C – Device C (e.g. CNT transistor 105)

US 10,333,088 B1

CARBON NANOTUBE TRANSISTOR WITH CARRIER BLOCKING USING THIN DIELECTRIC UNDER CONTACT

TECHNICAL FIELD

This disclosure relates to carbon nanotube (CNT) transistors with carrier blocking using a thin dielectric layer under the drain or source and drain contacts.

SUMMARY

The following presents a summary to provide a basic understanding of one or more embodiments of the invention. This summary is not intended to identify key or critical elements, or delineate any scope of the different embodiments or any scope of the claims. Its sole purpose is to present concepts in a simplified form as a prelude to the more detailed description that is presented later. The subject disclosure relates to carbon nanotube transistors with carrier blocking using a thin dielectric layer under the drain or source and drain contacts.

According to an embodiment, a transistor is provided that comprises a carbon nanotube (CNT) channel layer, a metal source contact formed on the CNT channel layer, and a metal drain contact formed on the CNT channel layer. The transistor structure further comprises a drain dielectric layer formed adjacent to and between a lower surface of the metal drain contact and an upper surface of the CNT channel layer. In particular, the drain dielectric layer is formed such that it contacts the upper surface of the CNT layer and further contacts an entirety of the lower surface of the metal drain contact. In some implementations, the metal source contact can contact the upper surface of the CNT layer.

In one or more implementations, the drain dielectric layer comprises a material that suppresses injection of a first type of carrier into the CNT channel layer and facilitates the injection of a second type of carrier into the CNT channel layer. In this regard, the drain dielectric layer can comprise a material that allows passage of a first type of carrier (e.g., either electrons or holes) through the drain dielectric layer at a higher rate relative to a second type of carrier (e.g., either holes or electrons) For example, in one implementation, the drain dielectric layer comprises a material with a conduction band offset (CBO) and valance band offset (VBO) that allows passage of a first type of carrier through the drain dielectric layer at a higher rate relative to the second type of carrier. In various implementations, the drain dielectric layer has a thickness less than or equal to 5.0 nanometers (nm).

In some embodiments, the transistor is a positive-type (P-type) transistor and the metal source contact and the metal drain contact respectively comprise a metal selected from a group comprising palladium (Pd) and platinum (Pt). With these embodiments, the drain dielectric layer can comprise a material with a CBO between about 0.5 electron-volts (eV) and 5.0 eV, and a VBO between about −1.0 eV and 1.0 eV. In another embodiment, the transistor is a N-type transistor and the metal source contact and the metal drain contact respectively comprise a metal selected from a group comprising erbium (Er) and scandium (Sc). With this embodiment, the drain dielectric layer can comprise a material with a CBO between about −1.0 eV and 1.0 eV, and a VBO between about 0.5 eV and 5.0 eV.

In one or more additional embodiments, a transistor is provided that comprises a CNT channel layer, a metal source contact formed on the CNT channel layer, and a source dielectric layer formed adjacent to and between a first lower surface of the metal source contact and an upper surface of the CNT channel layer. The transistor further comprises a metal drain contact formed on the CNT channel layer, and a drain dielectric layer formed adjacent to and between a second lower surface of the metal drain contact and the upper surface of the CNT channel layer. With these embodiments, both the source dielectric layer and the drain dielectric layer can comprise a material that suppresses injection of a first type of carrier into the CNT channel layer and facilitates the injection of a second type of carrier into the CNT channel layer.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION

Figure 1A:
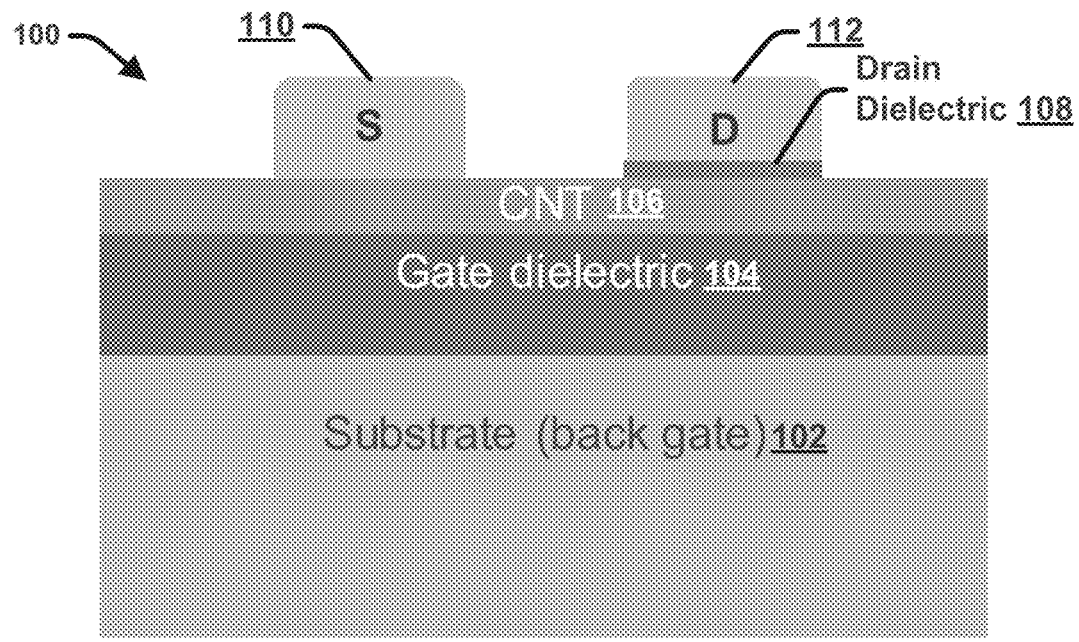
FIGS. 1A-1D present example, non-limiting cross-sectional views of carbon nanotube (CNT) transistors having global back-gates and carrier blocking dielectric under the drain or source and drain contacts in accordance with embodiments described herein.

The following detailed description is merely illustrative and is not intended to limit embodiments and/or application or uses of embodiments. Furthermore, there is no intention to be bound by any expressed or implied information presented in the preceding Summary section or in the Detailed Description section.

The subject disclosure relates to CNT transistors with carrier blocking using a thin dielectric layer under the drain or source and drain contacts. A carbon nanotube transistor or carbon nanotube field-effect transistor (CNTFET) refers to a field-effect transistor (FET) that utilizes a single carbon nanotube or an array of carbon nanotubes as the channel material instead of bulk silicon as in the traditional metal oxide semiconductor transistor (MOSFET) structure. The subject disclosure provides new CNT transistors that have a thin layer of dielectric (e.g., between about 0.1 nm to 5.0 nm) directly under the drain contact or directly under both the source and drain contacts. The thin dielectric layer comprises a material that is selected with appropriate conduction/valence band offsets to block one type of carrier from injection into the carbon nanotube channel, thereby reducing or eliminating the undesired ambipolar behavior exhibited by conventional CNT transistors with short channel lengths (e.g., less than 100 nm) or with large source/drain bias (e.g., larger than 1.0 V). By reducing or eliminating the ambipolar behavior, the subject CNT transistors can thus have extremely small channel lengths (e.g., less than 10 nm) while exhibiting a high ON/OFF ratio relative to other short channel length CNT transistors. The subject CNT transistors further exhibit a substantially reduced amount of leakage current when the transistor is in the OFF state.

One or more embodiments are now described with reference to the drawings, wherein like referenced numerals are used to refer to like elements throughout. It should be appreciated that the various structures depicted in the drawings (e.g., the antimicrobial bandage apparatus, the nanostructure layer, the silicon nanospikes, the mold, etc.) are merely example and are not drawn to scale. In the following description, for purposes of explanation, numerous specific details are set forth in order to provide a more thorough understanding of the one or more embodiments. It is evident, however, in various cases, that the one or more embodiments can be practiced without these specific details.

It is to be understood that the various layers and/or regions shown in the accompanying drawings are not drawn to scale, and that one or more layers and/or regions of a type commonly used in complementary metal-oxide semiconductor (CMOSs), MOSFETs and/or other semiconductor devices may not be explicitly shown in a given drawing. This does not imply that the layers and/or regions not explicitly shown are omitted from the actual transistor devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

As used herein, unless otherwise specified, terms such as "on," "overlying," "atop," "on top," "positioned on," or "positioned atop" can mean that a first element is present on a second element, wherein intervening elements may be present between the first element and the second element. As used herein, unless otherwise specified, the term "directly" used in connection with the terms "on," "overlying," "atop," "on top," "positioned," "positioned atop," "contacting," or the term "direct contact," can mean that a first element and a second element are connected without any intervening elements, such as, for example, intermediary conducting, insulating or semiconductor layers, present between the first element and the second element. As used herein, terms such as "upper," "lower," "above," "below," "directly above," "directly below," "aligned with," "adjacent to," "right," "left," "vertical," "horizontal," "top," "bottom," and derivatives thereof can relate to the disclosed structures as oriented in the drawing figures.

Turning now to the drawings, FIGS. 1A-1D presents cross-sectional views of example back-gate CNT transistors having global back-gates and carrier blocking dielectric under the drain or source and drain contacts in accordance with embodiments described herein. Repetitive description of like elements employed in respective embodiments of the disclosed CNT transistors is omitted for sake of brevity.

FIG. 1A presents an example back-gate CNT transistor 100 in accordance with one example embodiment. In the embodiment shown, the example back-gate CNT transistor 100 can comprise a substrate 102 that functions as a global back gate. In this regard, the material of the substrate 102 can comprise a suitable metal, including but not limited to: nickel (Ni), cobalt (Co), iron (Fe), copper (Cu), gold (Au), silver (Ag), ruthenium (Ru), palladium (Pd), platinum (Pt), iridium (Ir), tungsten (W). The thickness of the substrate 102 can vary. For example, in one implementation, the thickness of the substrate can range from about 100 microns to about 500 microns. The example back-gate CNT transistor 100 can further comprise a gate dielectric layer 104 formed on the substrate 102 and a CNT channel layer 106 formed on the gate dielectric layer 104. The CNT channel layer 106 can comprise a single CNT or an array of two or more CNTs. The material and thickness of the gate dielectric layer 104 can vary. For example, some suitable materials for the gate dielectric layer 104 can include but are not limited to: hydrogen silsesquioxane (HSQ), aluminum oxide ($Al_2O_3$) or hafnium oxide ($HfO_2$), silicon dioxide ($SiO_2$), silicon nitride ($Si_3N_4$). In one implementation, the gate dielectric layer 104 can have a thickness between about 1 nm and about 10 nm. In another implementation, the gate dielectric layer 104 can have a thickness between about 20 nm and about 300 nm.

The back-gate CNT transistor 100 can further comprise a source contact 110, and a drain contact 112, respectively formed on the CNT channel layer 106. The source contact 110 and the drain contact 112 can respectively be formed out of a suitable metal, including but not limited to: erbium (Er) and scandium (Sc), Pd, Pt, rhodium (Rh), Au, Ni, Co, lanthanum (La). In various embodiments, the metal employed for the source contact 110 and the drain contact 112, respectively, can be selected based on whether the back-gate CNT transistor 100 is formed as an N-type FET or a P-type FET. For example, N-type field effect transistors (NFETs) and p-type field effect transistors (PFETs) are two types of complementary MOSFETs. An NFET includes n-doped source/drain regions and utilizes electrons as current carriers, whereas a PFET includes p-doped source/drain regions and uses holes (generally represented by the variable $h^+$) current carriers. In this regard, in some embodiments, the back-gate CNT transistor 100 (and the various additional transistors disclosed herein) can be or correspond to an NFET and employ electrons (generally represented by the variable $e^-$) as carriers. In other embodiments, the back-gate CNT transistor 100 (and the various additional transistors disclosed herein) can be or correspond to a PFET and employ holes (generally represented by the variable h+) as current carriers. In one example implementation in which the back-gate CNT transistor 100 (and the additional transistors disclosed herein) is or corresponds to an NFET, the source contact 110 and the drain contact 112 can respectively comprise (or otherwise be formed out of) a metal including but not limited to, Er an Sc. In another example implementation in which the back-gate CNT transistor 100 (and the additional transistors disclosed herein) is or corresponds to an NFET, the source contact 110 and the drain contact 112 can respectively comprise (or otherwise be formed out of) a metal including but not limited to Pd and Pt.

The back-gate CNT transistor 100 can further comprise a drain dielectric layer 108 formed below the drain contact 112 between the drain contact 112 and the CNT channel layer 106. For example, in the embodiment shown, the drain dielectric layer 108 can be formed adjacent to and between a lower surface of the drain contact 112 and an upper surface of the CNT channel layer 106. In this regard, the drain dielectric layer 108 can contact the upper surface of the CNT channel layer 106 and the lower surface of the drain contact 112. In some embodiments, the drain dielectric layer 108 can contact an entirety of the lower surface of the drain contact 112. In one or more embodiments, the drain dielectric layer 108 can be self-aligned with the drain contact 112 or otherwise be formed directly below the drain contact 112. In this regard, in association with fabrication of the back-gate CNT transistor 100, in one or more embodiments, a thin layer of dielectric material can be deposited on the surface of the CNT channel layer 106. The drain contact 112 can then be formed on the thin layer of dielectric material. The thin layer of dielectric material can further be patterned (e.g., using etching or another suitable technique) using the drain contact 112 as a mask, thereby resulting in formation of the drain dielectric layer 108.

The thickness of the drain dielectric layer 108 can be substantially thin relative to the other layers or elements of the back-gate transistor CNT transistor 100. For example, in some embodiments, the thickness of the drain dielectric layer 108 can be less than or equal to about 50.0 nm. In another embodiment, the thickness of the drain dielectric layer 108 can be less than or equal to about 25.0 nm. In another embodiment, the thickness of the drain dielectric layer 108 can be less than or equal to about 10.0 nm. In another embodiment, the thickness of the drain dielectric layer 108 can be less than or equal to about 5.0 nm. Still in yet another embodiment, the thickness of the drain dielectric layer 108 can be between 0.1 nm and about 2.5 nm.

The material employed for the drain dielectric layer 108 can be selected to facilitate passage of one type of carrier (e.g., either electrons or holes), while or inhibiting passage of the other. In this regard, the material of the drain dielectric layer 108 can facilitate injection of one type of carrier into the CNT channel layer 106 while inhibiting the injection of the other type of carrier into the CNT channel layer 106. Accordingly, the material employed for the drain dielectric layer 108 will vary based on whether the back-gate CNT transistor is deployed as an NFET or a PFET. For example, some suitable dielectric materials that can be employed for the drain dielectric layer 108 in embodiments in which the back-gate CNT transistor 100 (and other transistors described herein) is or corresponds to a NFET can include but are not limited to, $Ta_2O_5$, or $BaTiO_3$, ZnO, and $BaZrO_3$. Some dielectric materials that can be employed for the drain dielectric layer 108 in embodiments in which the back-gate CNT transistor 100 (and other transistors described herein) is or corresponds to a PFET can include but are not limited to, $La_2O_2$, $TiO_2$ and $Si_3N_4$.

In an example embodiment, the material of the drain dielectric layer 108 can comprise a material that allows passage of one type of carrier therethrough (and thus allows injection of the one type of carrier into the CNT channel layer 106), while entirely blocking passage of the other type of carrier therethrough (and thus blocks injection of the one type of carrier into the CNT channel layer 106). In other embodiments, the material employed for the drain dielectric layer 108 can allow passage of one type of carrier therethrough while substantially blocking passage of the other type of carrier therethrough. In this regard, the material employed for the drain dielectric layer 108 can comprise a material that allows passage of a first type of carrier through the drain dielectric layer 108 at a higher rate relative to the second type of carrier. The higher the rate the better. For example, in one embodiment the material employed for the drain dielectric layer 108 can comprise a material that allows passage of a first type of carrier through the drain dielectric layer 108 at a rate at least 10% higher relative to the second type of carrier. In another embodiment, the material employed for the drain dielectric layer 108 can comprise a material that allows passage of a first type of carrier through the drain dielectric layer 108 at a rate at least 25% higher relative to the second type of carrier. In another embodiment, the material employed for the drain dielectric layer 108 can comprise a material that allows passage of a first type of carrier through the drain dielectric layer 108 at a rate at least 50% higher relative to the second type of carrier. In another embodiment, the material employed for the drain dielectric layer 108 can comprise a material that allows passage of a first type of carrier through the drain dielectric layer 108 at a rate at least 75% higher relative to the second type of carrier. In another embodiment, the material employed for the drain dielectric layer 108 can comprise a material that allows passage of a first type of carrier through the drain dielectric layer 108 at a rate at least 90% higher relative to the second type of carrier.

In various embodiments, the conduction band offset (CBO) and the valance band offset (VBO) of the material employed for the drain dielectric layer 108 can control the degree to which a particular type of carrier passes therethrough. In this regard, the material employed for the drain dielectric layer 108 can comprise a material with a CBO and a VBO that facilitates passage of one type of carrier while inhibiting or substantially inhibiting passage of the other. In some implementations, the metal work function can be adapted to match CBO/VBO.

In one embodiment wherein the back-gate CNT transistor 100 is or corresponds to a P-type transistor, the drain dielectric layer 108 can comprise a material with a CBO between about 0.1 eV and 1.0 eV, and a VBO between about −0.5 eV and 0.0 eV. In another embodiment, wherein the back-gate CNT transistor 100 is or corresponds to a P-type transistor, the drain dielectric layer 108 can comprise a material with a CBO between about 0.5 eV and 5.0 eV, and a VBO between about −2.0 eV and 1.0 eV. In either of these embodiments, the source contact 110 and the drain contact 112 can respectively comprise a metal selected from a group comprising Pd and Pt.

In another embodiment, wherein the back-gate CNT transistor 100 is or corresponds to a N-type transistor, the drain dielectric layer 108 can comprise a material with a CBO between about −0.5 eV and 0.0 eV, and a VBO between about 0.1 eV and 1.0 eV. In another embodiment wherein the back-gate CNT transistor 100 is a N-type transistor, the drain dielectric layer 108 can comprise a material with a CBO between about −2.0 eV and 1.0 eV, and a VBO between about 0.5 eV and 5.0 eV. In either of these embodiments, the source contact 110 and the drain contact 112 can respectively comprise a metal selected from a group comprising Er and Sc.

Figure 1B:
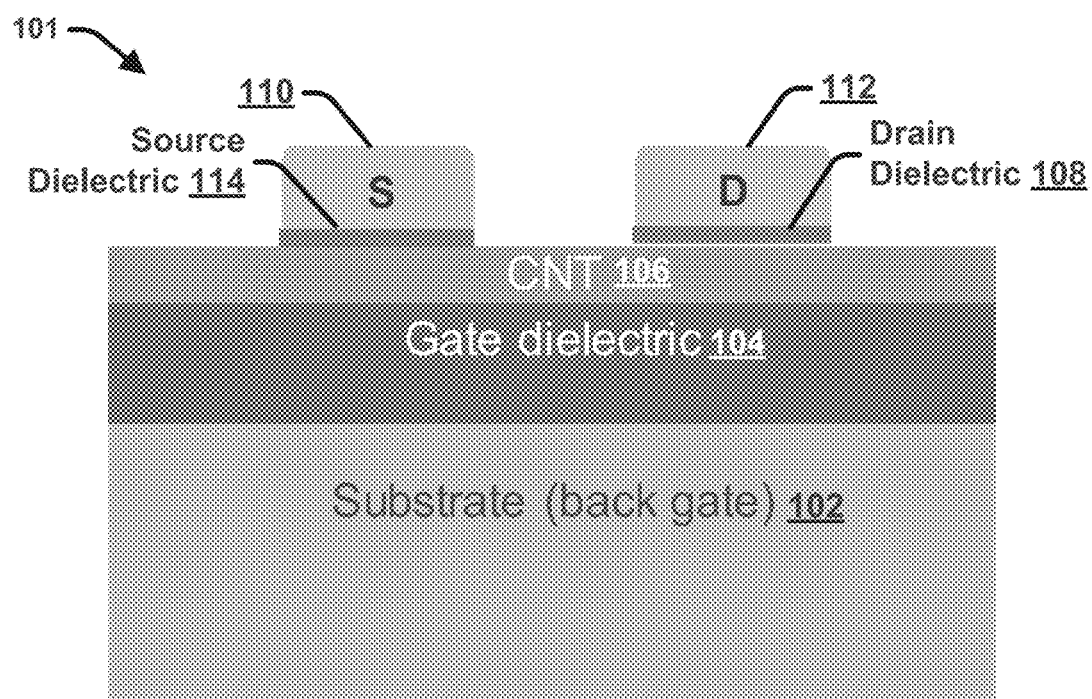

FIG. 1B presents another example back-gate CNT transistor 101 in accordance with another example embodiment. The back-gate CNT transistor 101 can include same or similar features and functionalities as back-gate CNT transistor 100 with the addition of a source dielectric layer 114 formed below the source contact 110. In this regard, the source dielectric layer 114 can include same or similar features and functionalities as the drain dielectric layer 108. For example, in various embodiments, the source dielectric layer 114 can comprise the same material and thickness as the drain dielectric layer 108. In addition, similar to the drain dielectric layer 108, the source dielectric layer 114 can be formed adjacent to and between a lower surface of the source contact 110 and an upper surface of the CNT channel layer 106. In this regard, the source dielectric layer 114 can contact the upper surface of the CNT channel layer 106 and the lower surface of the source contact 110. In some embodiments, the source dielectric layer 114 can contact an entirety of the lower surface of the source contact 110. In one or more embodiments, the source dielectric layer 114 can be self-aligned with the source contact 110. In this regard, the in association with fabrication of the back-gate CNT transistor 101, in one or more embodiments, a thin layer of dielectric material can be deposited on the surface of the CNT channel layer 106. The source contact 110 and the drain contact 112 can then be formed on the thin layer of dielectric material. The thin layer of dielectric material can further be patterned (e.g., using etching or another suitable technique) using the source contact 110 and drain contact 112 as a mask, thereby resulting in the formation of the source dielectric layer 114 and the drain dielectric layer 108, respectively. In accordance with these embodiments, the source dielectric layer 114 and the drain dielectric layer 108 can comprise the same material and have the same thickness (e.g., between about 0.1 nm and about 5 nm). In one or more alternative embodiments, the materials employed for the source dielectric layer 114 and the drain dielectric layer 108 can be different.

With reference to FIG. 1A and FIG. 1B, the back-gate CNT transistor 100 differs from the back-gate CNT transistor 101, because the back-gate CNT transistor 101 comprises a thin dielectric layer under both the source and drain contacts, while the back-gate CNT transistor 100 comprises the thin dielectric layer only under the drain contact. In this regard, back-gate CNT transistors described here with only a thin layer of dielectric under the drain contact and not the source contact (e.g., back-gate CNT transistor 100 and various additional CNT transistors described herein), are referred to as asymmetric CNT transistors, while CNT transistors having a thin layer of dielectric under both the source contact 110 and the drain contact 112 are referred to as symmetric CNT transistors.

Figure 1C:
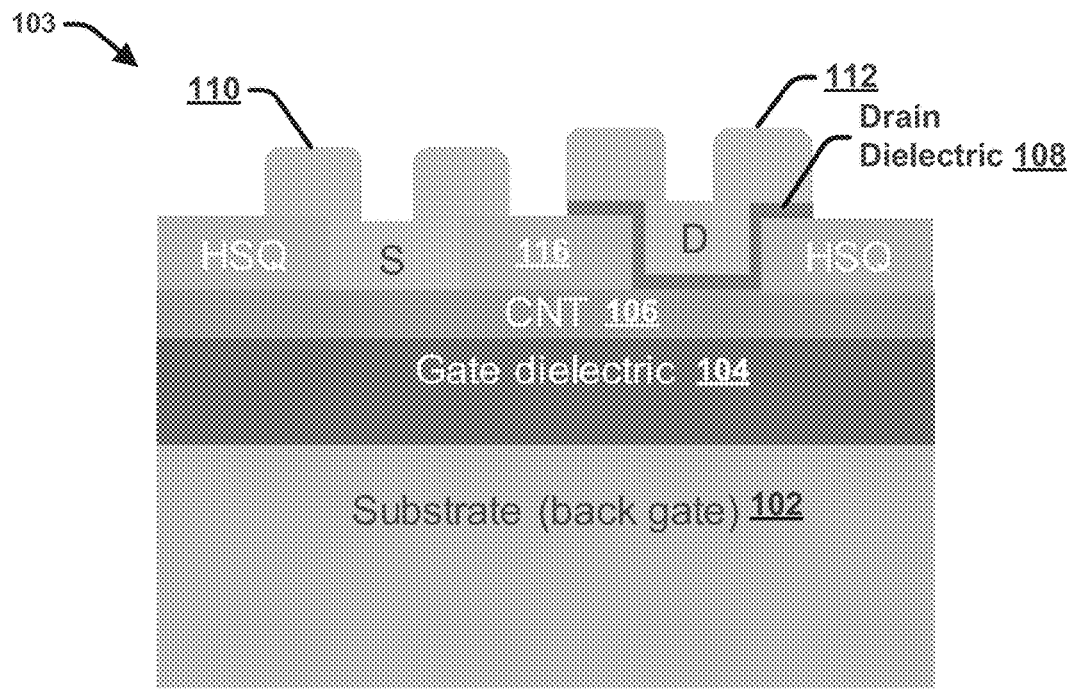

FIG. 1C presents another example back-gate CNT transistor 103 in accordance with another example embodiment. The back-gate CNT transistor 103 can include same or similar features and functionalities as back-gate CNT transistor 100 with the addition of a HSQ layer 116 formed on portions of the upper surface of the CNT channel layer 106 around the source contact 110 and the drain contact. The acronym HSQ stands for hydrogen silsesquioxanes, which are low-k dielectric materials. However, the material of the HSQ layer can vary and is not restricted to hydrogens silsesquioxanes. For example, the HSQ layer 116 can comprise various low-k dielectrics that are generally used as interlayer dielectric in advanced interconnect schemes. In one or more embodiments, the HSQ layer 116 can be employed to define the contact lengths ($L_{cont}$) for the source contact 110 and the drain contact 112.

Figure 1D:
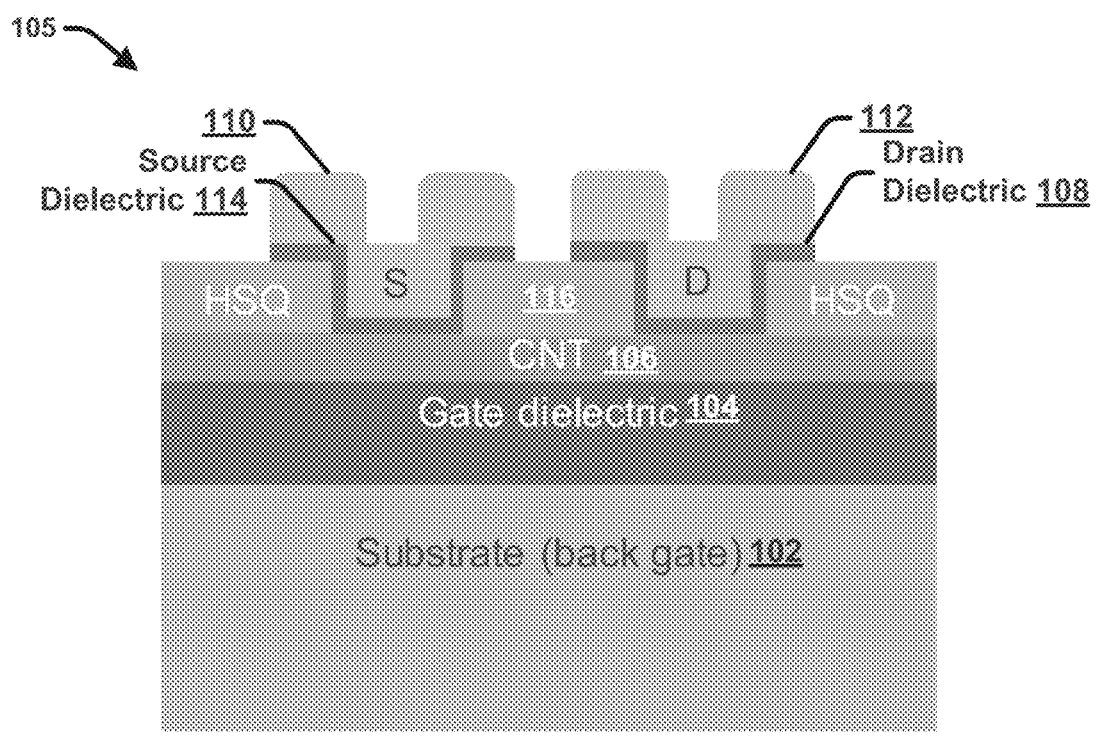

FIG. 1D presents another example back-gate CNT transistor 105 in accordance with another example embodiment. The back-gate CNT transistor 105 can include same or similar features and functionalities as back-gate CNT transistor 103 with the addition of the source dielectric layer 114 directly below the source contact.

With reference to FIGS. 1A-1D, by including a thin dielectric layer (e.g., drain dielectric layer 108) below the drain contact (e.g., drain contact 112), or below the source and drain contacts, that allows injection of one type of carrier into the CNT channel layer 106 while blocking or substantially blocking injection of the other type of carrier into the CNT channel layer 106, the back-gate CNT transistors 100, 101, 103, 105, and other CNT transistors disclosed herein, do not exhibit, (or exhibit reduced), ambipolar behavior relative to conventional CNT transistors with short channel lengths (e.g., less than 100 nm). The back-gate CNT transistors 100, 101, 103, 105, and other CNT transistors disclosed herein, can thus have an extremely small channel length while exhibiting a high ON/OFF ratio and low leakage current when the transistor is in the OFF state.

The channel length ($L_{ch}$) is generally defined by the distance between the source contact 110 and the drain contact 112. In one or more embodiments, the back-gate CNT transistors 100, 101, 103, 105, and other CNT transistors disclosed herein, can have a channel length less than 500 nm. In another embodiment, the back-gate CNT transistors 100, 101, 103, 105, and other CNT transistors disclosed herein, can have a channel length less than 100 nm. In another embodiment, the back-gate CNT transistors 100, 101, 103, 105, and other CNT transistors disclosed herein, can have a channel length less than 50 nm. Still in yet another embodiment, the back-gate CNT transistors 100, 101, 103, 105, and other CNT transistors disclosed herein, can have a channel length less than 10 nm.

Figure 2A:
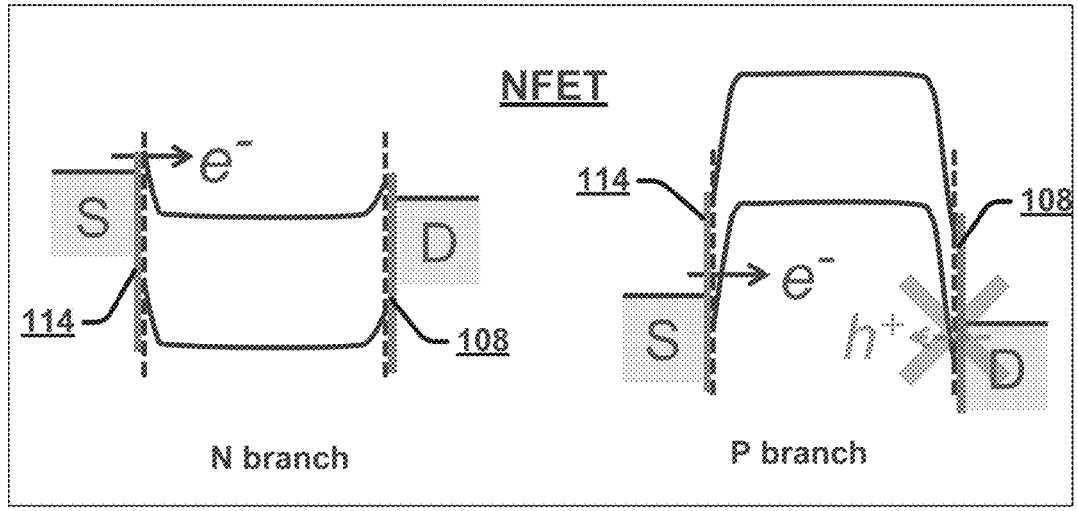
FIG. 2A illustrates an example, non-limiting mechanism that reduces ambipolar behavior in a negative-type (N-type) field effect, back-gate CNT transistor in accordance with embodiments described herein.

FIG. 2A illustrates a mechanism for reducing ambipolar behavior in a NFET type carbon nanotube (CNT) transistor in accordance with embodiments described herein. The source contact (e.g., source contact 110) is represented by the letter S, and the drain contact (e.g., drain contact 112) is represented by the letter D. In the embodiment shown, the drain contact D (e.g., drain contact 112) comprises a thin dielectric layer (e.g., drain dielectric layer 108) formed between the CNT channel and the drain contact D. The source contact (e.g., source contact 110) can also comprise a thin dielectric layer (e.g., source dielectric layer 114) formed between the CNT channel and the source contact. As discussed above, with NFET devices, the primary carriers are electrons ($e^-$). Accordingly, in order to reduce or eliminate ambipolar behavior characterized by leakage of holes into the CNT channel region when the CNT transistor is switched to the OFF state and the length CNT channel region is less than 100 nm, (e.g., which effectively reduces the ON/OFF ratio), the thin dielectric layer material used for the drain dielectric layer 108 (and the source dielectric layer 114 in some embodiments) can comprise a material (e.g., with a suitable band alignment with respect to CNT) that selectively allows the injection of electrons into the channel region (e.g., the region between the source contact and the drain contact) yet blocks or substantially blocks the injection of holes (h+) into the channel region. For example, in the embodiment shown, the N-branch is unrestricted (e.g., allowing for injection of electrons into the channel regions), while the P-branch is suppressed (e.g., wherein the holes are blocked from injection into the channel region.

Figure 2B:
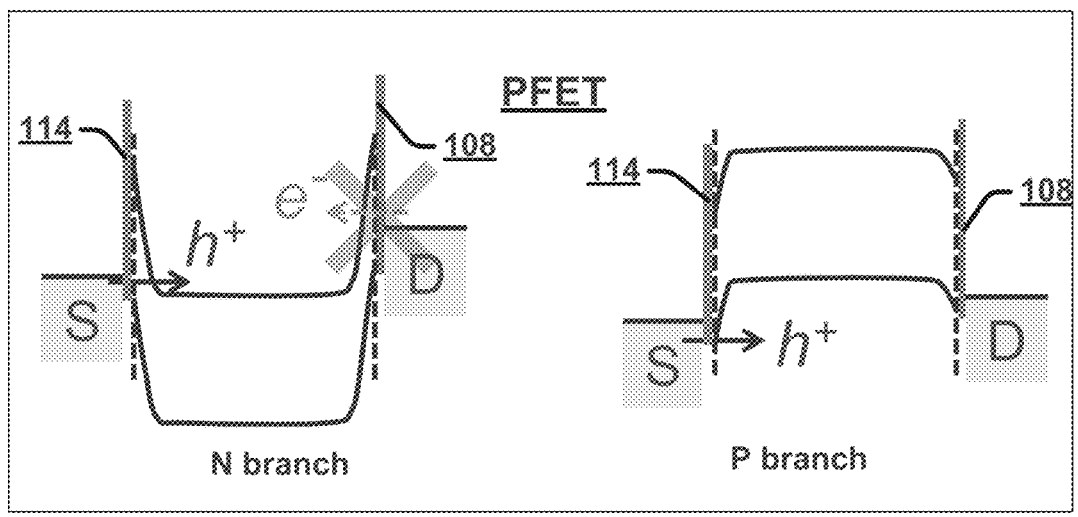
FIG. 2B illustrates an example, non-limiting mechanism that reduces ambipolar behavior in a P-type field-effect, back-gate CNT transistor in accordance with embodiments described herein.

FIG. 2B illustrates a mechanism for reducing ambipolar behavior in a PFET type CNT in accordance with embodiments described herein. In the embodiment shown, the drain contact D (e.g., drain contact 112) comprises a thin dielectric layer (e.g., drain dielectric layer 108) formed between the CNT channel and the drain contact D. The source contact (e.g., source contact 110) can also comprise a thin dielectric layer (e.g., source dielectric layer 114) formed between the CNT channel and the source contact. As discussed above, with PFET devices, the primary carriers are holes ($h^+$). Accordingly, in order to reduce or eliminate ambipolar behavior characterized by leakage of holes into the CNT channel region when the back-gate CNT transistor is switched to the OFF state and the length CNT channel region is less than 100 nm, (e.g., which effectively reduces the ON/OFF ratio), the thin dielectric layer material used for the drain dielectric layer 108 (and the source dielectric layer 114 in some embodiments) can comprise a material (e.g., with a suitable band alignment with respect to CNT) that selectively allows the injection of holes into the channel region, yet blocks or substantially blocks the injection of electrons ($e^-$) into the channel region. For example, in the embodiment shown, the N-branch is suppressed while the P-branch is unrestricted.

Figure 3:
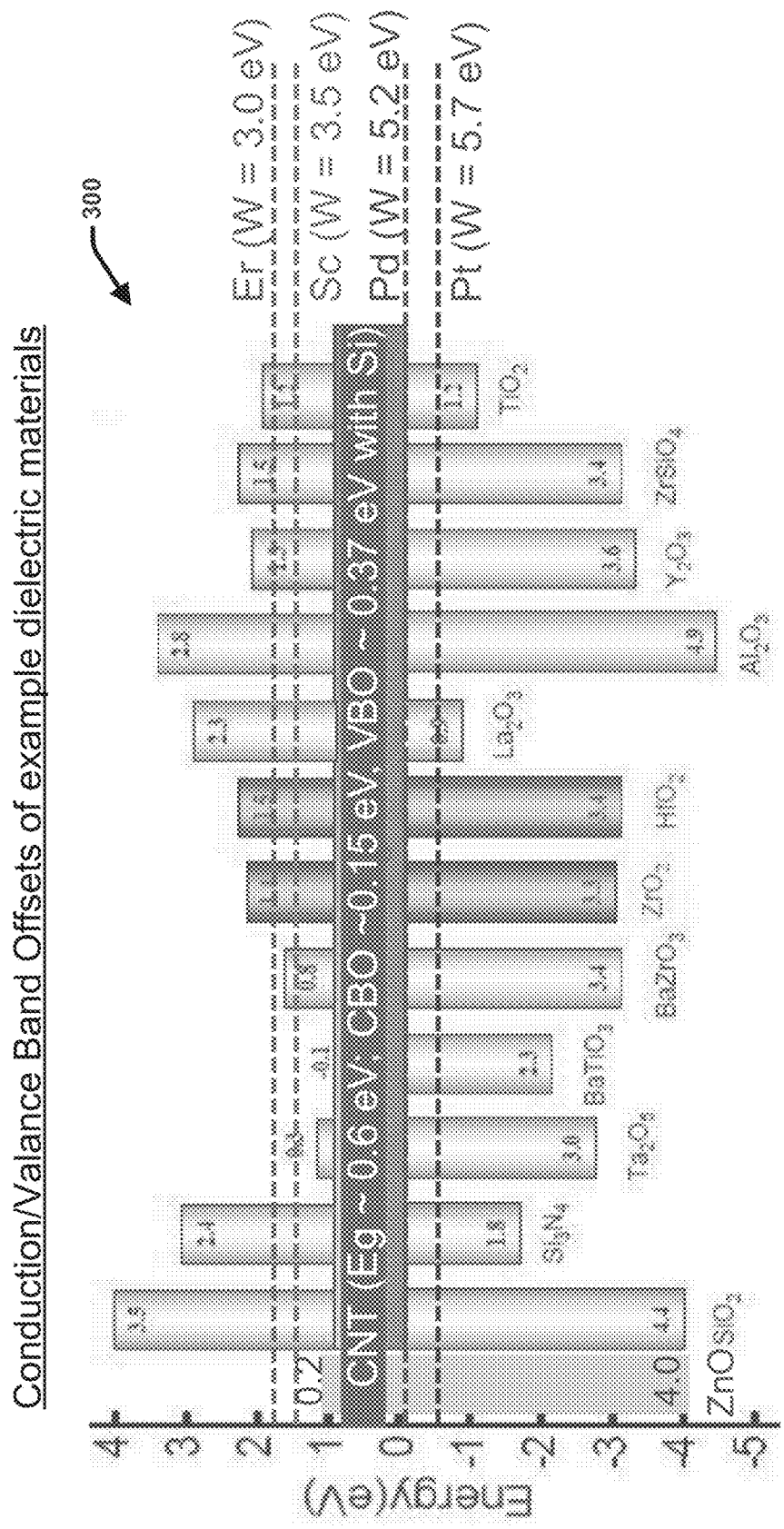
FIG. 3 provides an example, non-limiting chart illustrating the conduction band offsets and the valance band offsets for different types of dielectric materials in accordance with embodiments described herein.

FIG. 3 provides a chart 300 illustrating the conduction band offsets (CBO) and the valance band offsets (VBO) for different types of dielectric materials in accordance with embodiments described herein. The displayed CBO/VBO are referenced to Si. The values also depend on the deposition method for each dielectric, and hence are subjected to change from those presented in chart 300 (e.g., $TiO_2$, CBO: 0-0.7 eV). The metal work function (W) can also be adapted to match the CBO/VBO of the dielectric material employed for the thin dialectic layer under the metal contacts.

In one or more embodiments, suitable contacts for a P-type CNT include Pd (which has a W=5.2 eV) and Pt (which has a W=5.7 eV). With these embodiments, the thin dielectric layer formed under the drain or source and drain contacts can comprise a material with a CBO between about 0.5 eV and 5.0 eV, and a VBO between about −1.0 eV and 1.0 eV. For example, in the embodiment shown, some suitable materials for the thin dielectric layer capable of blocking or substantially blocking injection of electrons into the CNT channel region of a P-type CNT include $La_2O_3$ (which has a CBO between about 3.4 eV and 3.9 eV, and a VBO between about 0.4 eV and 0.9 eV), $TiO_2$ (which has a CBO between about 2.3 eV and 2.8 eV and a VBO between about 0.7 eV and 1.2 eV), and $Si_3N_4$ (which has a CBO between about 3.5 eV and 4.0 eV, and a VBO between about 1.3 eV and 1.8 eV).

In one or more embodiments, suitable contacts for a N-type CNT include Er (which has a W=3.0 eV) and Sc (which has a W=3.5 eV). With these embodiments, the thin dielectric layer formed under the drain or source and drain contacts can comprise a material with a CBO between about −1.0 eV and 1.0 eV, and a VBO between about 0.5 eV and 5.0 eV. For example, in the embodiment shown, some suitable materials for the thin dielectric layer capable of blocking or substantially blocking injection of holes into the CNT channel region of a N-type CNT include $Ta_2O_5$ (which has a CBO between about −0.7 eV and −0.2 eV, and a VBO between about 4.3 eV and 4.8 eV), $BaTiO_3$ (which has a CBO between about −0.9 eV and −0.4 eV, and a VBO between about 3.8 eV and 4.3 eV), ZnO (which has a CBO between about −0.8 eV and −0.3 eV, and a VBO between about 5.4 eV and 5.9 eV), and $BaZrO_3$ (which has a CBO between about −0.2 eV and 0.3 eV), and a VBO between about 4.2 eV and 4.7 eV).

Figure 4A:
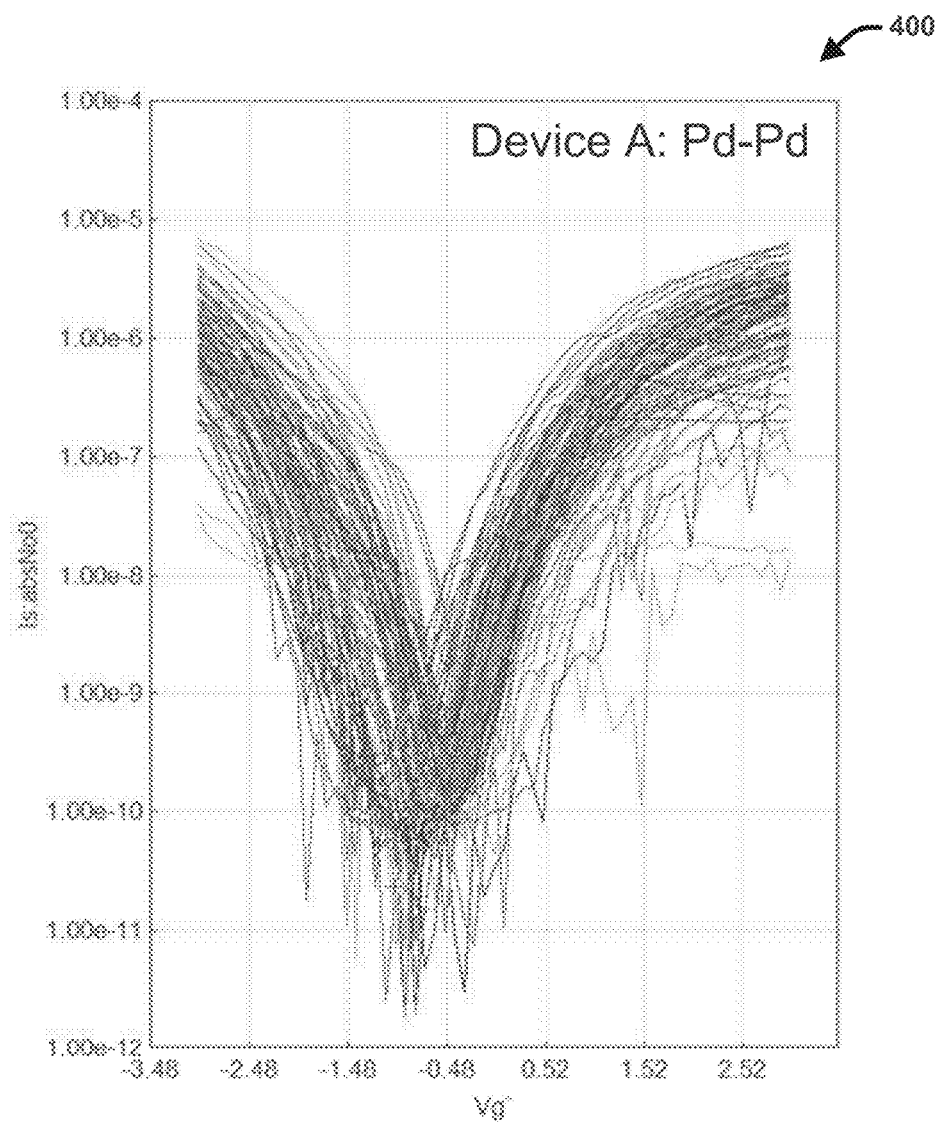
FIGS. 4A-4C present graphs illustrating performance metrics of back-gate CNT transistors with and without carrier blocking dielectric under the drain or source and drain contacts in accordance with embodiments described herein.
Figure 4A:
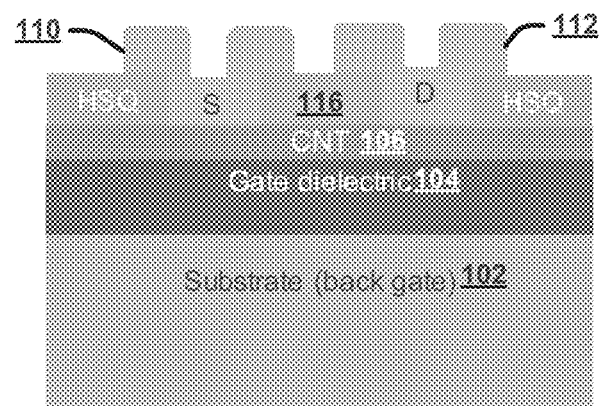
Figure 4B:
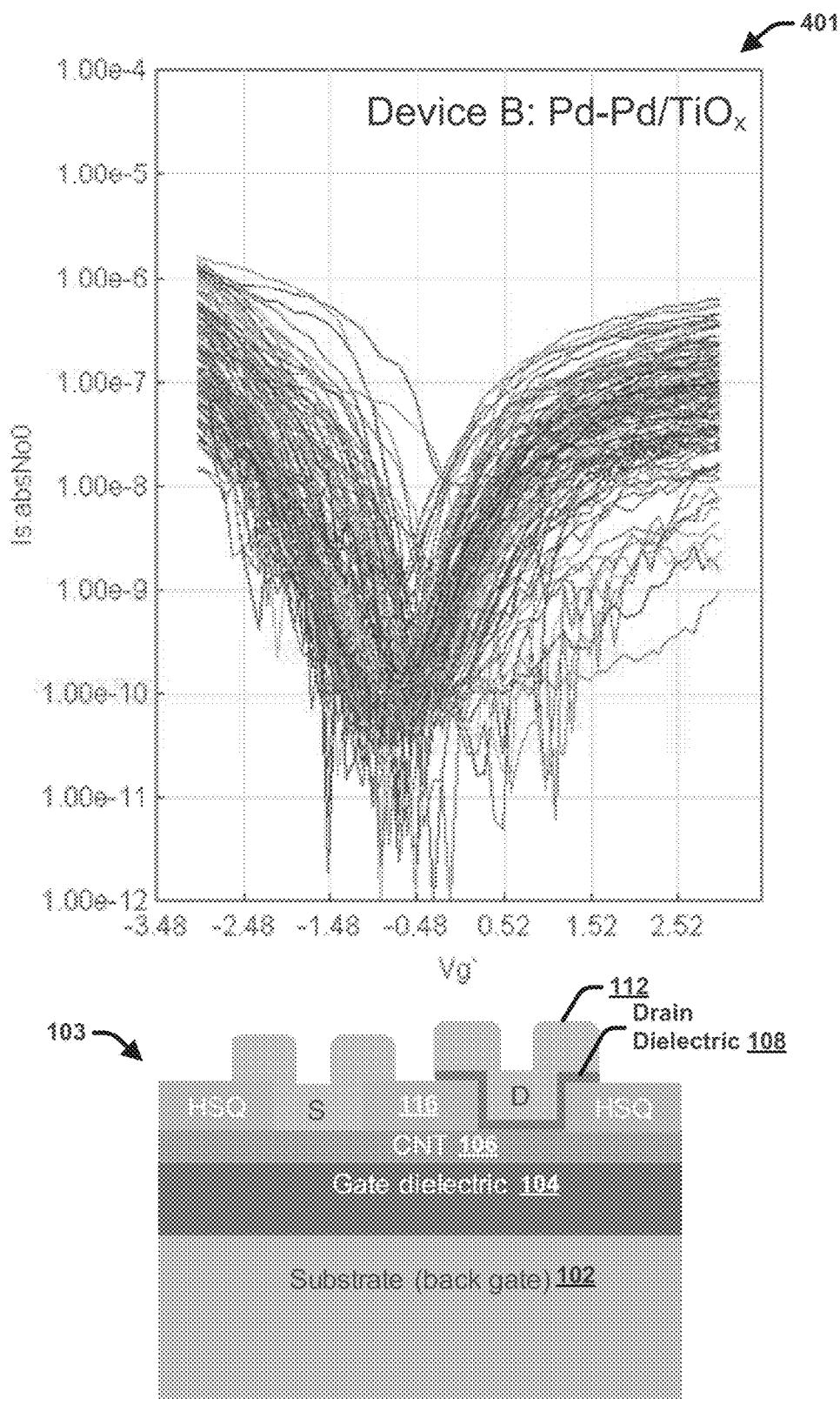
Figure 4C:
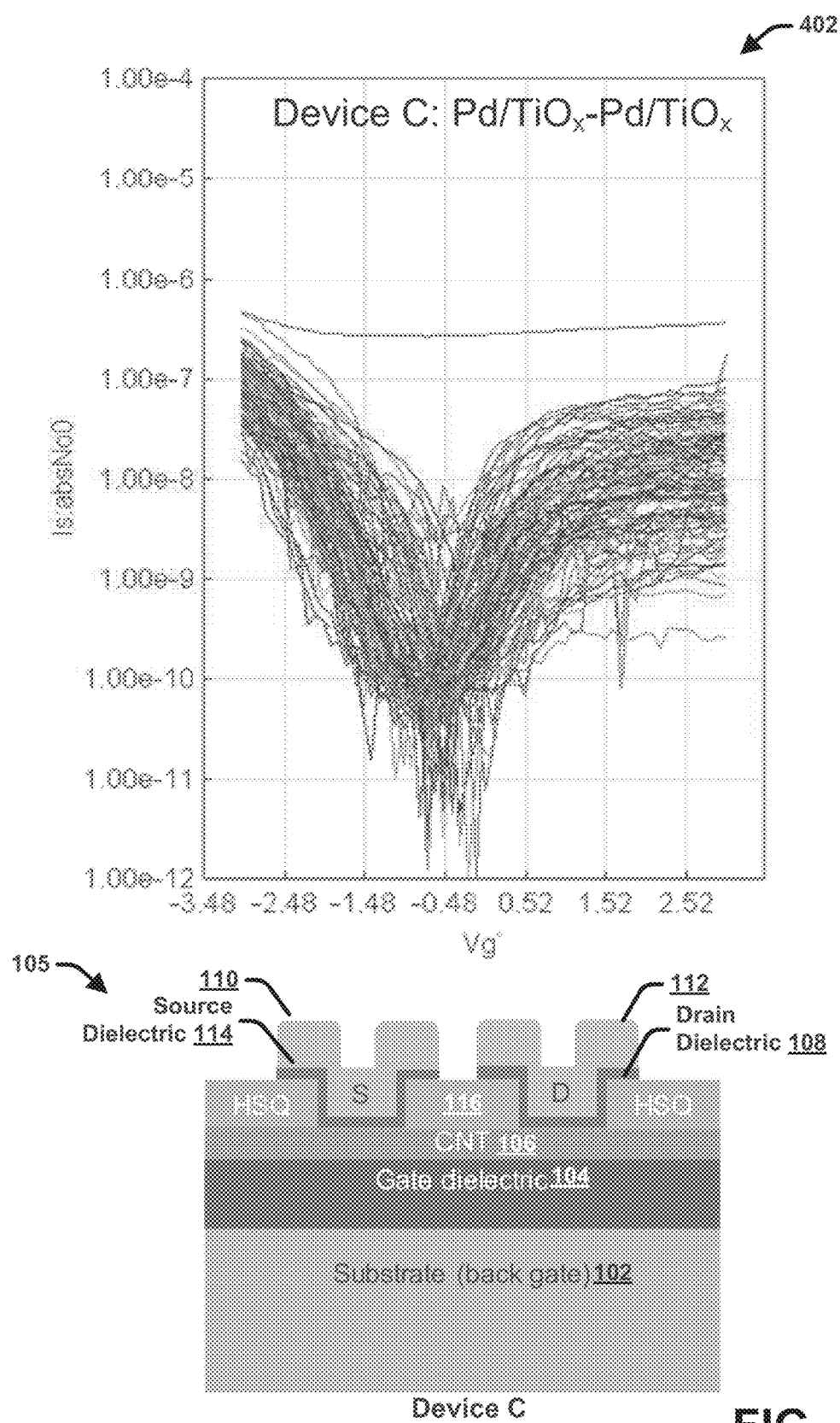

FIGS. 4A-4C present graphs illustrating performance metrics of example back-gate CNT transistors with and without carrier blocking dielectric under the drain or source and drain contacts in accordance with embodiments described herein. In particular, FIG. 4A presents a graph 400 illustrating the performance metrics of a back-gate CNT transistor without having any dielectric layer formed under the source and drain contacts. In the embodiment shown, the performance metrics reflected in graph 400 are based on back-gate CNT transistor that has the structure of device A. FIG. 4B presents a graph 401 illustrating the performance metrics of a back-gate CNT transistor having a thin layer of dielectric material comprising $TiO_x$ formed under the drain contact. The thickness of the $TiO_x$ layer is about 2.0 nm. In this regard, the performance metrics reflected in graph 401 are based on back-gate CNT transistor that has the structure of device B (e.g., which corresponds to back-gate CNT transistor 403). FIG. 4C presents a graph 402 illustrating the performance metrics of a back-gate CNT transistor having a thin layer of dielectric material comprising $TiO_x$ formed under both the source and drain contacts (e.g., with a thickness of about 2.0 nm). In this regard, the performance metrics reflected in graph 402 are based on back-gate CNT transistor that has the structure of device C (e.g., which corresponds to back-gate CNT transistor 405). The $TiO_x$ layers of device B and device C were respectively formed by depositing a thin layer (e.g., 0.1 to 5.0 nm) of Ti onto the CNT channel layer which was then converted to $TiO_x$ based oxidation in response to air exposure, prior to formation of the contacts. Each of the devices reflected in graphs 400, 401 and 402 (e.g., device A, device B, and device C, respectively), are P-type CNT transistors comprising Pd source and drain contacts. The respective devices A, B and C are further defined by a channel length of $L_{ch}$=250 nm, and a contact length of and $L_{cont}$=100 nm.

As shown by comparison of graphs 400 with graphs 401 and 402, device A having direct Pd source and drain contacts on the CNT channel layer contact exhibit significant ambipolar behavior relative to devices B and device C. In this regard, for device A, the N-branch and the P-branch have substantially the same contact level. However, for device B and device C, the $TiO_x$ suppresses the N-branch significantly more than the P-branch. For example, as shown in graphs 401 and 402, the electron conduction and the hole conduction are separate. Although the $TiO_x$ blocks both the hole conduction and the electron conduction, the $TiO_x$ blocks the electron conduction more than the hole conduction. Accordingly, the data reflected by graphs 400, 401 and 402 demonstrate that $TiO_x$ under the drain or source and drain contacts reduce the ambipolar behavior, even though it blocks both electron conduction and the hole conduction, because it blocks the electron conduction more than the hole conduction. In this regard, the ambipolar behavior can be increasingly reduced relative to that demonstrated by $TiO_x$ if a dielectric material having a stronger ability to block one type of carrier at a higher rate than the other is employed under the contacts.

Figure 5B:
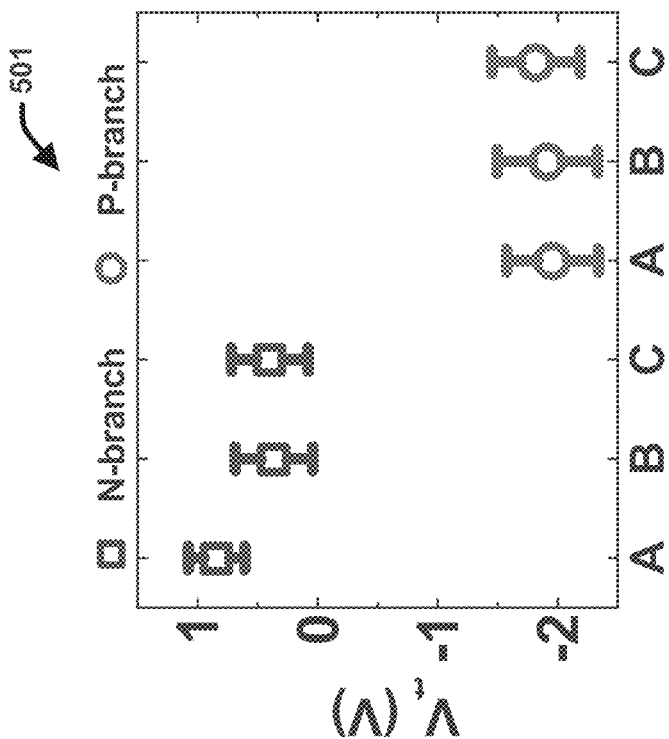
FIGS. 5A and 5B present charts illustrating performance metrics of the N-branch relative to the P-branch for back-gate CNT transistors with and without carrier blocking dielectric under the drain or source and drain contacts in accordance with embodiments described herein.
Figure 5A:
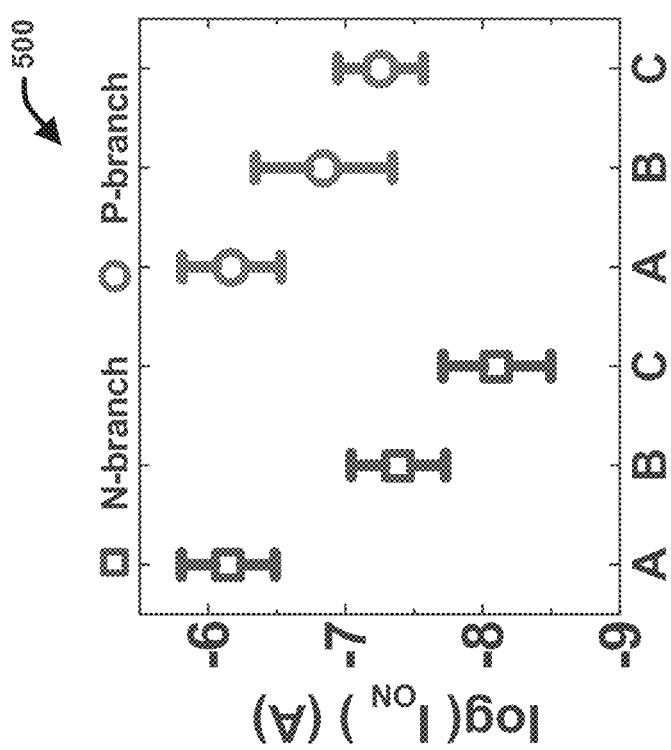

FIGS. 5A and 5B present charts illustrating performance metrics of the N-branch relative to the P-branch for the respective back-gate CNT transistors represented in FIGS. 4A-4C (e.g., device A, device B and device C). Repetitive description of like elements employed in respective embodiments of the disclosed CNT transistors is omitted for sake of brevity. FIG. 5A presents a chart 500 reflecting the extracted ON state current ($I_{ON}$) for both P- and N-branches in devices A, B and C. FIG. 5B presents a chart 501 reflecting the extracted threshold voltage ($V_t$) for both P- and N-branches in devices A, B and C. In the embodiments shown, for device A, the P-branch and the N-branch, currents are substantially at the same level. However, for device B and device C, the P-branch is higher than the N-branch, demonstrating that the TiO$_x$ dielectric layer under the drain contact or both the source and drain contacts suppressed the N-branch more than the P-branch, thereby reducing the ambipolar behavior associated with device A.

FIGS. 6A-6D present example, non-limiting cross-sectional views of CNT transistors having local embedded-gates and carrier blocking dielectric under the drain or source and drain contacts in accordance with embodiments described herein. Repetitive description of like elements employed in respective embodiments of the disclosed CNT transistors is omitted for sake of brevity.

Figure 6A:
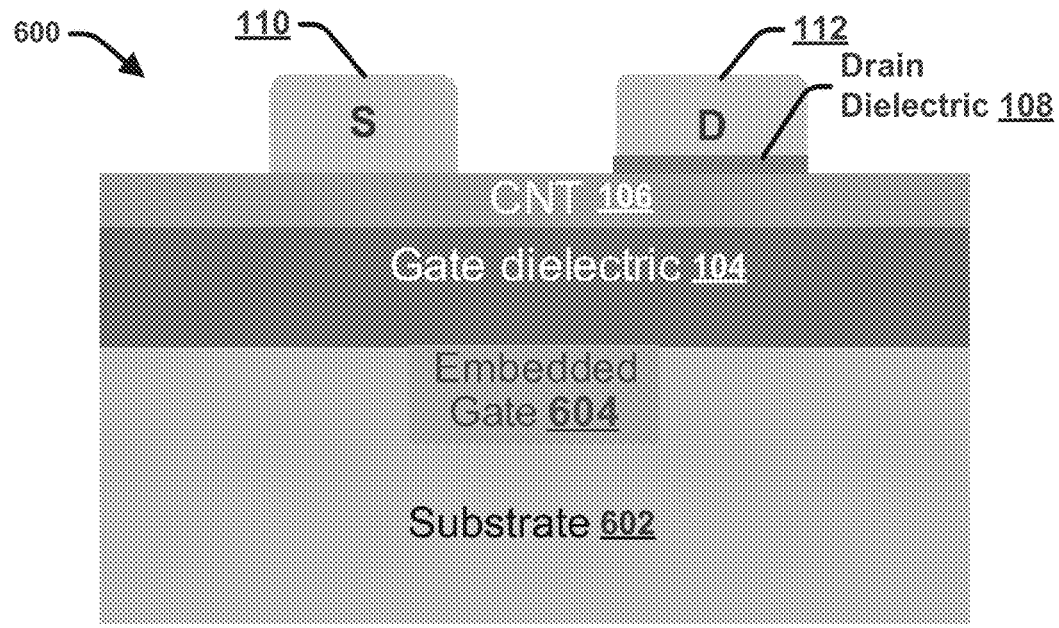
FIGS. 6A-6D present example, non-limiting cross-sectional views of embedded-gate CNT transistors having local embedded-gates and carrier blocking dielectric under the drain or source and drain contacts in accordance with embodiments described herein.

FIG. 6A presents an example asymmetric, embedded-gate CNT transistor 600 including an embedded gate 604 in accordance with an embodiment. The embedded-gate CNT transistor 600 includes same or similar features and functionalities as back-gate CNT transistor 100 with respect to the gate dielectric layer 104, the CNT channel layer 106, the source contact 110, the drain contact 112, and the drain dielectric layer 108. Embedded-gate CNT transistor 600 differs from back-gate CNT transistor 100 with respect to the gate electrode and substrate. In this regard, embedded-gate CNT transistor 600 includes a substrate 602 having an embedded gate 604. The embedded gate 604 is located within the substrate and positioned in alignment with (or directly below) the channel region of the CNT channel layer 106. In this regard, the channel region of the CNT channel layer 106 corresponds to the portion of the CNT channel layer 106 located between the source contact 110 and the drain contact. The material of the substrate 602 can vary. In some embodiments, the substrate 602 can comprise silicon (Si). Other suitable materials for the substrate 602 can include but are not limited to: strained Si, silicon carbide (SiC), germanium (Ge), silicon germanium (SiGe), silicon-germanium-carbon (SiGeC), Si alloys, Ge alloys, gallium arsenide (GaAs), indium arsenide (InAs), indium phosphide (InP), quartz (SiO$_2$), sapphire (Al$_2$O$_3$), or any combination thereof. The embedded gate 604 can be formed out of a suitable metal. For example, the embedded gate 604 can include a material including but not limited to: W, aluminum (Al), Au, Pd, etc.

Figure 6B:
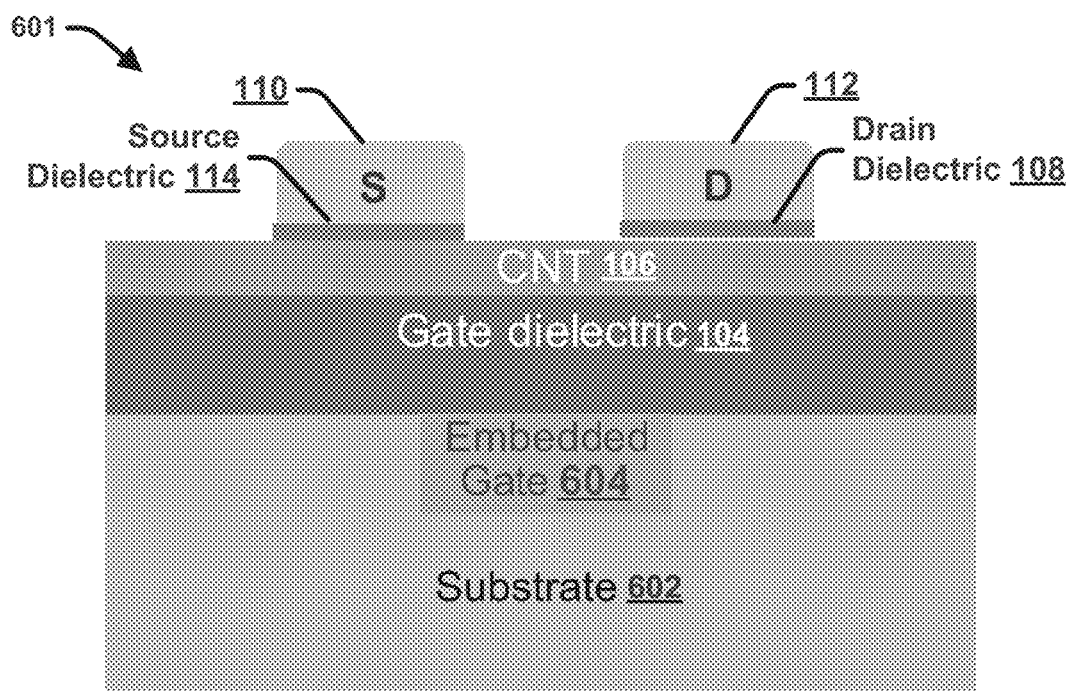

FIG. 6B presents an example symmetric, embedded-gate CNT transistor 601 including an embedded gate 604 in accordance with an embodiment. The embedded-gate CNT transistor 601 includes same or similar features and functionalities as embedded-gate CNT transistor 600 with the addition of a source dielectric layer 114 below the source contact 110.

Figure 6C:
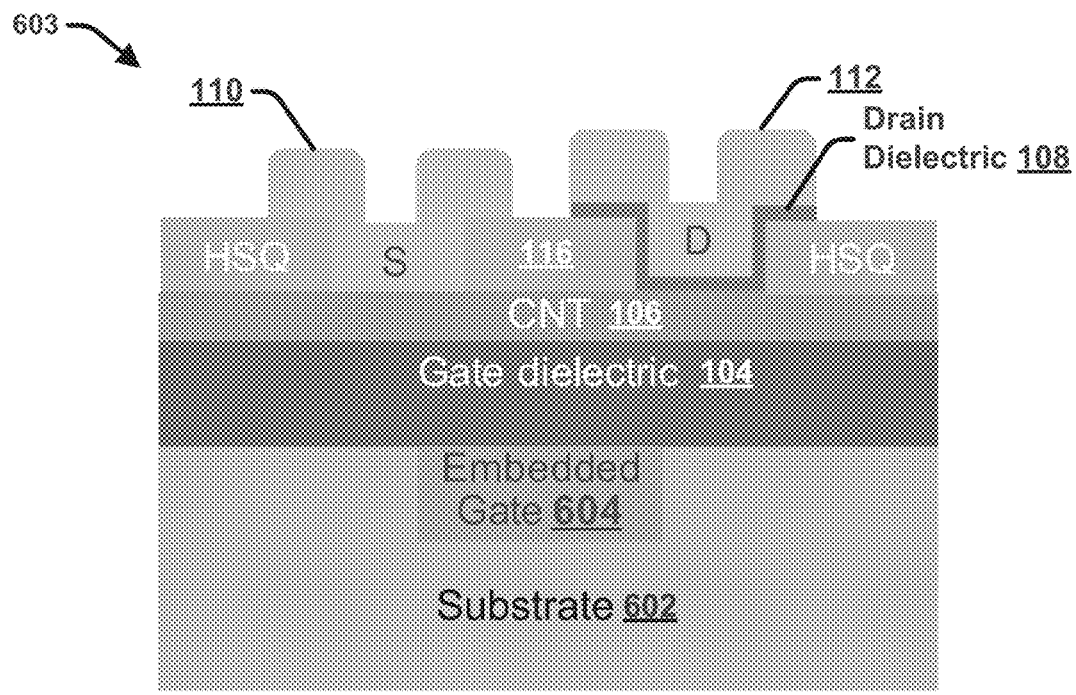

FIG. 6C presents another example asymmetric, embedded-gate CNT transistor 603 including an embedded gate 604 in accordance with an embodiment. The embedded-gate CNT transistor 603 includes same or similar features and functionalities as embedded-gate CNT transistor 600 with the addition of a HSQ layer 116 formed on surfaces of the CNT channel layer 106 excluding the surfaces of the CNT channel layer 106 contacting the source contact 110 and the drain dielectric layer 108, respectively.

Figure 6D:
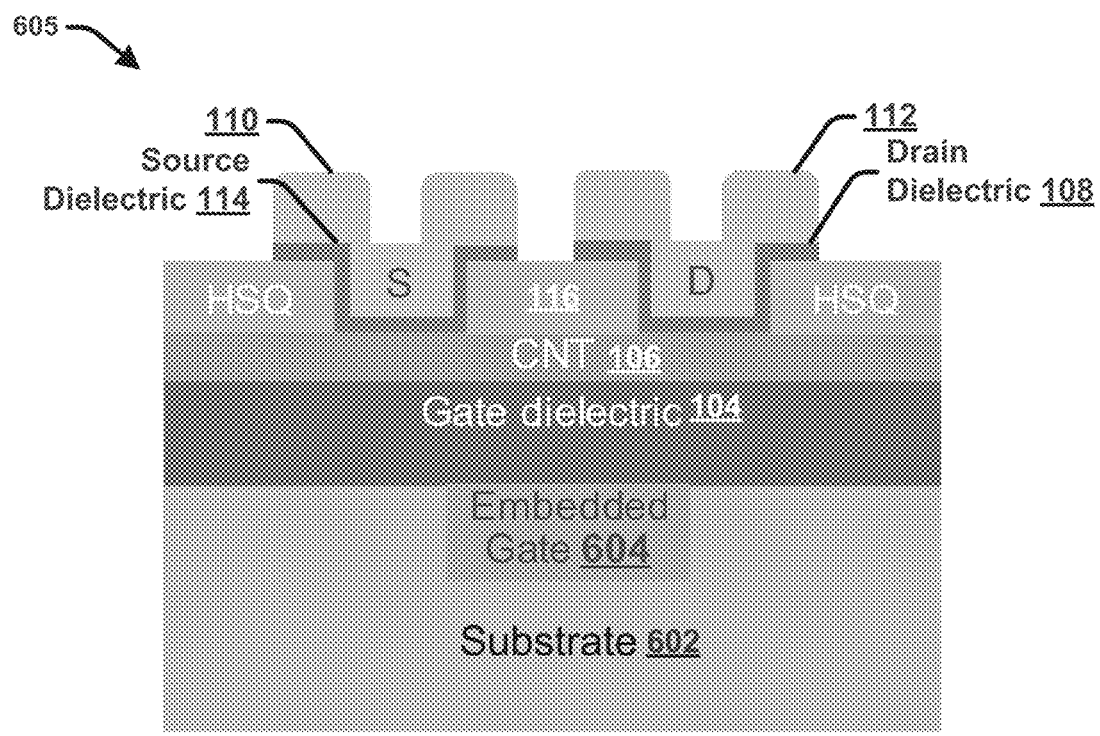

FIG. 6D presents another example symmetric, embedded-gate CNT transistor 605 including an embedded gate 604 in accordance with an embodiment. Embedded-gate CNT transistor 605 includes same or similar features and functionalities as embedded-gate CNT transistor 601 with the addition of a HSQ layer 116 formed on surfaces of the CNT channel layer 106 excluding the surfaces of the CNT channel layer 106 contacting the source dielectric layer 114 and the drain dielectric layer 108, respectively.

Figure 7A:
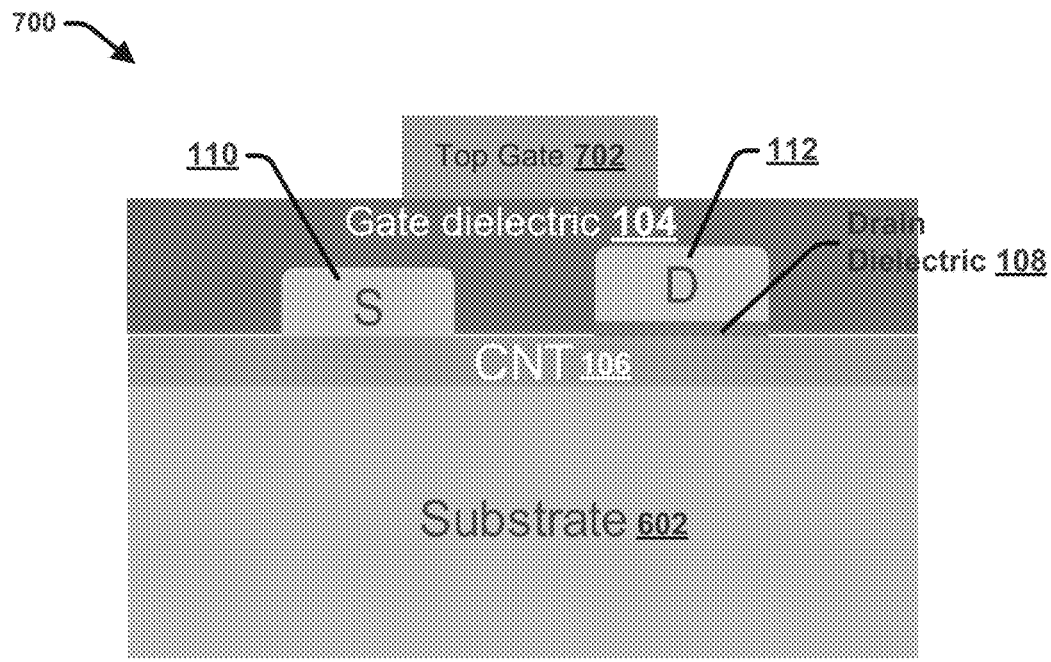
FIGS. 7A and 7B present example, non-limiting cross-sectional views of top-gate CNT transistors having top-gates and carrier blocking dielectric under the drain or source and drain contacts in accordance with embodiments described herein.
Figure 7B:
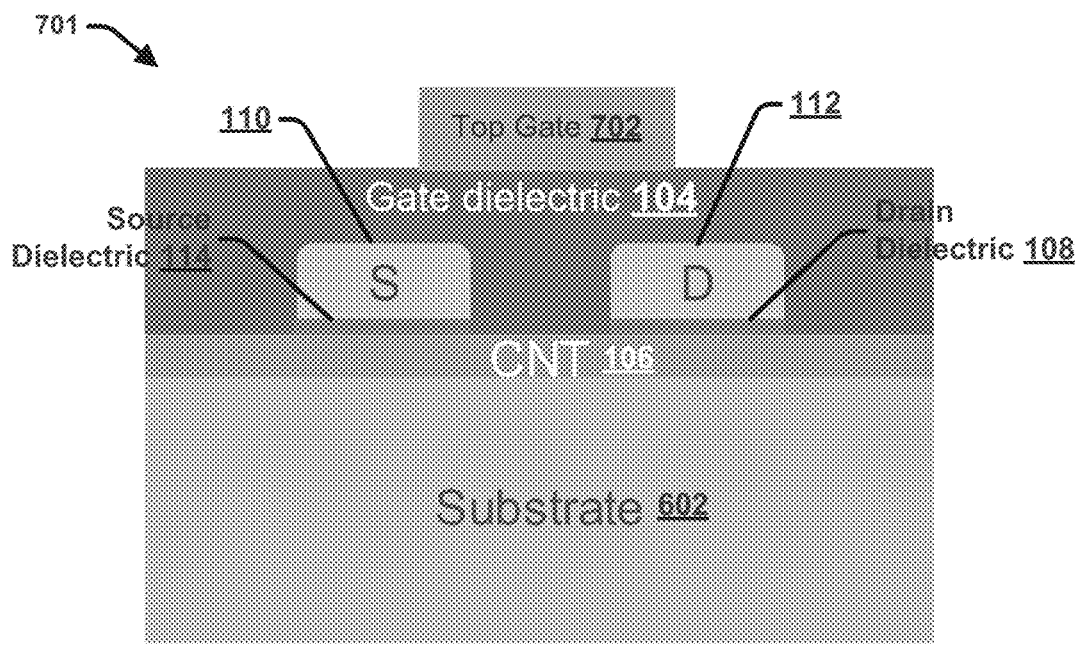

FIGS. 7A and 7B present example, non-limiting cross-sectional views of top-gate CNT transistors having top-gates and carrier blocking dielectric under the drain or source and drain contacts in accordance with embodiments described herein. Repetitive description of like elements employed in respective embodiments of the disclosed CNT transistors is omitted for sake of brevity.

FIG. 7A presents an example asymmetric, top-gate CNT transistor 700 including a top-gate 702 in accordance with an embodiment. The top-gate CNT transistor 700 includes same or similar features and functionalities as the embedded-gate CNT transistor 600 with respect to the substrate 602, the CNT channel layer 106, the source contact 110, the drain contact 112, and the drain dielectric layer 108. The top-gate CNT transistor 700 differs from embedded-gate CNT transistor 600 with respect to the gate electrode and the gate dielectric layer 104. In this regard, the gate dielectric layer 104 is formed over and around the source contact 110 and the drain contact 112 such that the source contact 110 and the drain contact 112 are embedded within the gate dielectric layer 104. The top-gate CNT transistor 700 further includes a top-gate 702 formed on the gate dielectric layer at position that is aligned with (or directly above) the channel region of the CNT channel layer 106. The top-gate 702 can be formed out of a suitable metal. For example, the top-gate 702 can include a material including but not limited to: W, Al, Au, Pd, etc.

FIG. 7B presents an example symmetric, top-gate CNT transistor 701 including a top-gate 702 in accordance with an embodiment. Top-gate CNT transistor 701 includes same or similar features and functionalities as top-gate CNT transistor 700 with the addition of a source dielectric layer 114 below the source contact 110.

What has been described above includes examples of the embodiments of the present invention. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims. Moreover, the above description of illustrated embodiments of the subject disclosure, including what is described in the Abstract, is not intended to be exhaustive or to limit the disclosed embodiments to the precise forms disclosed. While specific embodiments and examples are described in this disclosure for illustrative purposes, various modifications are possible that are considered within the scope of such embodiments and examples, as those skilled in the relevant art can recognize.

In this regard, with respect to any figure or numerical range for a given characteristic, a figure or a parameter from one range may be combined with another figure or a parameter from a different range for the same characteristic to generate a numerical range. Other than in the operating examples, or where otherwise indicated, all numbers, values and/or expressions referring to quantities of ingredients, reaction conditions, etc., used in the specification and claims are to be understood as modified in all instances by the term "about."

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of appended claims, and equivalents thereof.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

Moreover, the words "example" or "example" are used in this disclosure to mean serving as an example, instance, or illustration. Any aspect or design described in this disclosure as "example" is not necessarily to be construed as preferred or advantageous over other aspects or designs. Rather, use of the words "example" or "example" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. A transistor, comprising:
   a carbon nanotube channel layer;
   a metal source contact formed on the carbon nanotube channel layer;
   a metal drain contact formed on the carbon nanotube channel layer; and
   a drain dielectric layer formed adjacent to and between a lower surface of the metal drain contact and an upper surface of the carbon nanotube channel layer, wherein the drain dielectric layer contacts the upper surface of the carbon nanotube layer and further contacts an entirety of the lower surface of the metal drain contact.

2. The transistor of claim 1, wherein the drain dielectric layer comprises a material that suppresses injection of a first type of carrier into the carbon nanotube channel layer and facilitates the injection of a second type of carrier into the carbon nanotube channel layer.

3. The transistor of claim 1, wherein the drain dielectric layer comprises a material that allows passage of a first type of carrier through the drain dielectric layer at a higher rate relative to a second type of carrier.

4. The transistor of claim 1, wherein the drain dielectric layer comprises a material with a conduction band offset and valance band offset that allows passage of a first type of carrier through the drain dielectric layer at a higher rate relative to a second type of carrier.

5. The transistor of claim 1, wherein the drain dielectric layer has a thickness less than or equal to 5.0 nanometers.

6. The transistor of claim 1, wherein the transistor is a positive-type (P-Type) transistor, wherein the metal source contact and the metal drain contact respectively comprise a metal selected from a group consisting of palladium (Pd) and platinum (Pt), and wherein the source dielectric layer and the drain dielectric layer respectively comprise a material with a conduction band offset between about 0.5 electron-volts (eV) and 5.0 eV, and a valance band offset between about −1.0 eV and 1.0 eV.

7. The transistor of claim 1, wherein the transistor is a negative-type (N-Type) transistor, wherein the metal source contact and the metal drain contact respectively comprise a metal selected from a group consisting of erbium (Er) and scandium (Sc), and wherein the source dielectric layer and the drain dielectric layer respectively comprise a conduction band offset between about −1.0 eV and 1.0 eV, and a valance band offset between about 0.5 eV and 5.0 eV.

8. A transistor, comprising:
   a carbon nanotube channel layer;
   a metal source contact formed on the carbon nanotube channel layer;
   a source dielectric layer formed adjacent to and between a first lower surface of the metal source contact and an upper surface of the carbon nanotube channel layer;
   a metal drain contact formed on the carbon nanotube channel layer; and
   a drain dielectric layer formed adjacent to and between a second lower surface of the metal drain contact and the upper surface of the carbon nanotube channel layer, wherein the drain dielectric layer comprises a material with a conduction band offset and valance band offset that allows passage of a first type of carrier through the drain dielectric layer at a higher rate relative to a second type of carrier.

9. The transistor of claim 8, wherein the source dielectric layer contacts the upper surface of the carbon nanotube layer and further contacts a first entirety of the first lower surface of the metal source contact, and wherein the drain dielectric layer contacts the upper surface of the carbon nanotube layer and further contacts a second entirety of the second lower surface of the metal drain contact.

10. The transistor of claim 8, wherein the source dielectric layer and the drain dielectric layer respectively comprise a material that suppresses injection of a first type of carrier into the carbon nanotube channel layer and facilitates the injection of a second type of carrier into the carbon nanotube channel layer.

11. The transistor of claim 8, wherein the source dielectric layer and the drain dielectric layer respectively comprise a material that allows passage of a first type of carrier through the drain dielectric layer at a higher rate relative to a second type of carrier.

12. The transistor of claim 8, wherein the source dielectric layer and the drain dielectric layer respectively have a thickness less than or equal to 5.0 nanometers.

13. The transistor of claim 8, wherein the transistor is a positive-type (P-Type) transistor, wherein the metal source contact and the metal drain contact respectively comprise a metal selected from a group consisting of palladium (Pd) and platinum (Pt), and wherein the source dielectric layer and the drain dielectric layer respectively comprise a material with a conduction band offset between about 0.5 electron-volts (eV) and 5.0 eV, and a valance band offset between about −1.0 eV and 1.0 eV.

14. The transistor of claim 8, wherein the transistor is a negative-type (N-Type) transistor, wherein the metal source contact and the metal drain contact respectively comprise a metal selected from a group consisting of erbium (Er) and scandium (Sc), and wherein the source dielectric layer and the drain dielectric layer respectively comprise a conduction band offset between about −1.0 eV and 1.0 eV, and a valance band offset between about 0.5 eV and 5.0 eV.

15. A transistor, comprising:
   a substrate comprising a back gate;
   a carbon nanotube channel layer formed on the substrate;
   a metal source contact formed on and contacting the carbon nanotube channel layer;
   a metal drain contact formed on the carbon nanotube channel layer; and
   a drain dielectric layer formed adjacent to and between a lower surface of the metal drain contact and an upper surface of the carbon nanotube channel layer, wherein the drain dielectric layer contacts the upper surface of the carbon nanotube layer and further contacts an entirety of the lower surface of the metal drain contact.

16. The transistor of claim 15, wherein the drain dielectric layer comprises a material that suppresses passage of a first type of carrier through the drain dielectric layer to a greater degree relative to a second type of carrier.

17. The transistor of claim 15, wherein the drain dielectric layer comprises a material with a conduction band offset and valance band offset that suppresses injection of a first type of carrier into the carbon nanotube layer to a greater degree relative to a second type of carrier.

* * * * *